(12) United States Patent
Nagoshi et al.

(10) Patent No.: US 9,531,014 B2
(45) Date of Patent: Dec. 27, 2016

(54) STAINLESS STEEL FOR FUEL CELL SEPARATORS

(71) Applicant: JFE STEEL CORPORATION, Tokyo (JP)

(72) Inventors: Masayasu Nagoshi, Kawasaki (JP); Shinsuke Ide, Ames, IA (US); Shin Ishikawa, Chiba (JP); Noriko Makiishi, Chiba (JP)

(73) Assignee: JFE STEEL CORPORATION, Tokyo (JP)

( * ) Notice: Subject to any disclaimer, the term of this patent is extended or adjusted under 35 U.S.C. 154(b) by 0 days.

(21) Appl. No.: 14/355,661

(22) PCT Filed: Nov. 28, 2012

(86) PCT No.: PCT/JP2012/007626
§ 371 (c)(1),
(2) Date: May 1, 2014

(87) PCT Pub. No.: WO2013/080533
PCT Pub. Date: Jun. 6, 2013

(65) Prior Publication Data
US 2014/0272668 A1    Sep. 18, 2014

(30) Foreign Application Priority Data

Nov. 30, 2011   (JP) ................ 2011-261797

(51) Int. Cl.
| H01M 2/08 | (2006.01) |
| H01M 8/02 | (2016.01) |
| C22C 38/18 | (2006.01) |
| C22C 38/50 | (2006.01) |
| C21D 6/00 | (2006.01) |

(Continued)

(52) U.S. Cl.
CPC .............. *H01M 8/021* (2013.01); *C21D 6/004* (2013.01); *C21D 8/0278* (2013.01); *C22C 38/18* (2013.01); *C22C 38/50* (2013.01); *H01M 2008/1095* (2013.01); *Y02E 60/50* (2013.01)

(58) Field of Classification Search
CPC ........ H01M 8/021; C22C 38/18; C22C 38/50; C21D 6/004; C21D 8/0278
See application file for complete search history.

(56) References Cited

FOREIGN PATENT DOCUMENTS

| EP | 1 726 674 A1 | 11/2006 |
| JP | A-8-180883 | 7/1996 |

(Continued)

OTHER PUBLICATIONS

Jun. 25, 2015 Search Report issued in European Application No. 12853172.0.

(Continued)

*Primary Examiner* — Helen O Conley
(74) *Attorney, Agent, or Firm* — Oliff PLC

(57) ABSTRACT

A stainless steel having a low surface contact resistance for fuel cell separators is provided. The stainless steel has a Cr content of 16 to 40 mass % or more. The stainless steel includes a region having a fine textured structure on its surface, and the area percentage of the region is 50% or more, preferably 80% or more. The region having a fine textured structure is a region which has a structure having depressed portions and raised portions at an average interval between depressed portions or raised portions of 20 nm or more and 150 nm or less when observed with a scanning electron microscope.

11 Claims, 7 Drawing Sheets

(51) Int. Cl.
    *C21D 8/02*    (2006.01)
    *H01M 8/10*    (2016.01)

(56)          References Cited

FOREIGN PATENT DOCUMENTS

JP         A-10-228914      8/1998
    JP         A-2000-277133    10/2000
    JP         A-2005-302713    10/2005
    JP         A-2007-26694     2/2007
    JP         A-2010-153353    7/2010
    JP         A-2010-225560    10/2010
    JP         A-2011-29008     2/2011
    JP         A-2011-151015    8/2011

OTHER PUBLICATIONS

International Search Report issued in International Patent Application No. PCT/JP2012/007626 dated Jan. 8, 2013.

100 nm

— 100 nm

— 100 nm 200 nm

STAINLESS STEEL FOR FUEL CELL SEPARATORS

TECHNICAL FIELD

The present invention relates to a stainless steel for fuel cell separators that has excellent surface contact resistance (hereinafter also referred to as contact resistance) characteristics.

BACKGROUND ART

From the perspective of global environmental conservation, fuel cells that have high electric power generation efficiency and do not emit carbon dioxide are being developed. Fuel cells generate electricity through a reaction of hydrogen with oxygen. A fuel cell basically has a sandwich structure and includes an electrolyte membrane (ion-exchange membrane), two electrodes (a fuel electrode and an air electrode), diffusion layers for hydrogen and oxygen (air), and two separators. Various fuel cells have been developed, in terms of types of electrolyte being used, such as phosphoric acid fuel cells, molten carbonate fuel cells, solid oxide fuel cells, alkaline fuel cells, and solid polymer fuel cells.

Among these fuel cells, as compared with molten carbonate fuel cells, phosphoric acid fuel cells and the like, solid polymer fuel cells advantageously (1) have a significantly low operating temperature of approximately 80° C., (2) can have a light and small battery main body, and (3) have a short transient time, high fuel efficiency, and a high output density. Thus, solid polymer fuel cells are one type of fuel cells receiving the greatest attention today as on-board power sources for electric vehicles and compact distributed power sources for home use (stationary type compact electric generators) and for portable use.

Solid polymer fuel cells, on their working principles, generate electricity from hydrogen and oxygen through a polymer membrane. Solid polymer fuel cells have a structure as illustrated in FIG. 1. The solid polymer fuel cell illustrated in FIG. 1 includes a membrane-electrode assembly (MEA having a thickness of several tens to several hundreds of micrometers) 1 disposed between gas diffusion layers 2 and 3 each formed of a carbon cloth or the like, which are disposed between separators 4 and 5. The membrane-electrode assembly (MEA) 1 is composed of a polymer membrane and an electrode material, such as carbon black carrying a platinum catalyst, both being integrated on the front and back sides of the polymer membrane. This is a unit cell i.e. a single cell and generates electro motive force between the separators 4 and 5. Here, the gas diffusion layers are often integrated with the MEA. Several tens to several hundreds of such single cells are connected in series to form a fuel cell stack in practical use.

Each of the separators serves as a partition between the single cells and also needs to have functions of (1) a conductor that carries generated electrons, (2) a channel for oxygen (air) or hydrogen (an air channel 6 or a hydrogen channel 7 in FIG. 1), and (3) a channel for water and exhaust gas (the air channel 6 or the hydrogen channel 7 in FIG. 1).

In order to develop solid polymer fuel cells for practical use, separators to be used should have high durability and electroconductivity. Some practically used solid polymer fuel cells up to now include separators formed of a carbonaceous material, such as graphite. However, such carbonaceous separators have disadvantage that they are liable to break on impact, are difficult to reduce in size, and require high processing costs for the formation of channels. In particular, high costs are the greatest obstacle to the spread of fuel cells. Thus, attempts have been made to use metallic materials, such as titanium alloys, particularly stainless steel, instead of carbonaceous materials.

Patent Literature 1 discloses a technique for using a metal that can easily form a passivation film for a separator. However, the formation of a passivation film results in a high contact resistance and low electric power generation efficiency. Thus, it has been pointed out as problems to be solved that such a metallic material has a higher contact resistance than carbonaceous materials and low corrosion resistance.

In order to solve the problems, Patent Literature 2 discloses a technique for coating a surface of a metallic separator, for example, formed of SUS 304, with gold to reduce contact resistance and increase output. However, it is difficult to prevent the formation of a pinhole in a thin gold coating. A thick gold coating requires an increased cost.

Patent Literature 3 discloses a method for dispersing a carbon powder on a ferritic stainless steel substrate to manufacture a separator having improved electroconductivity. However, a surface treatment of a separator using a carbon powder is also expensive. It has also been pointed out as a problem that a possible flaw made in a surface-treated separator during assembling significantly deteriorates the corrosion resistance of the separator.

Under such situations, the same applicant filed Patent Literature 4, which discloses a technique for directly using a stainless steel as it is and controlling its surface profile to achieve a low contact resistance and high corrosion resistance. A stainless steel sheet described in Patent Literature 4 has an average peak interval of 0.3 µm or less in its surface roughness profile and can have a contact resistance of 20 $m\Omega \cdot cm^2$ or less. This technique has made it possible to provide a fuel cell separator material made of a stainless steel. In fuel cell design, however, there is a demand for further improvement in contact resistance characteristics, and it is desirable to consistently have a contact resistance of 10 $m\Omega \cdot cm^2$ or less.

In fuel cells, the contact resistance of a positive electrode (air electrode) subjected to a high electric potential tends to increase due to surface degradation. Thus, it is necessary for a separator to maintain a contact resistance of 10 $m\Omega \cdot cm^2$ or less for a long time in the operating environment.

A higher area percentage of a portion having a predetermined surface roughness on stainless steel is advantageous to the characteristics described above. However, the manufacture of a stainless steel sheet having a high area percentage of a portion having a predetermined surface roughness requires strict manufacturing condition control and quality control, resulting in an expensive stainless steel sheet. Thus, it is industrially preferable to achieve the desired performance when the area percentage of a portion having a predetermined surface roughness is less than 100% but more than a certain percentage.

Patent Literature 5 discloses a Mo-containing stainless steel having a low surface contact resistance for fuel cell separators. The area percentage of a region having a fine textured structure (micropit) on the steel surface is 50% or more. However, a study by the present inventors shows that such a textured structure mainly composed of pits does not have a low contact resistance for a long time.

In general, fuel cell separators are formed by press forming of a sheet material. It is desirable that the contact resistance not be increased significantly by sliding in contact with a die in press working. In Patent Literature 2 or 3 in which a film is formed on a surface, the film is partly detached by processing, and the detached portion must be subjected to a batch treatment after press working. This unfavorably increases the number of processes, reduces production efficiency, and increases the cost of the separator.

CITATION LIST

Patent Literature

PTL 1: Japanese Unexamined Patent Application Publication No. 8-180883
PTL 2: Japanese Unexamined Patent Application Publication No. 10-228914
PTL 3: Japanese Unexamined Patent Application Publication No. 2000-277133
PTL 4: Japanese Unexamined Patent Application Publication No. 2005-302713
PTL 5: Japanese Unexamined Patent Application Publication No. 2007-26694

SUMMARY OF INVENTION

Technical Problem

The present invention has been made in view of such situations, and it is an object of the present invention to provide a stainless steel having a low surface contact resistance for fuel cell separators.

Solution to Problem

The present inventors extensively studied a method for improving the surface contact resistance characteristics (hereinafter also referred to as the contact resistance characteristics) of a stainless steel for fuel cell separators and maintaining the surface contact resistance for a long time through the control of the surface texture of the stainless steel even when the area percentage of a portion having the controlled surface structure is less than 100%. As a result, the present inventors obtained the following findings.

The surface contact resistance characteristics of steel greatly depend on the surface fine asperities and are effectively improved by optimizing the surface fine asperities. In order to improve the surface contact resistance characteristics, that is, reduce the surface contact resistance of a steel surface, it is necessary to provide the steel surface with a region having a fine textured structure that includes an average interval of depressed portions or raised portions of 20 nm or more and 150 nm or less (an average spacing of fine asperities) and to have an area percentage of the region with a certain percentage or more. Here, in the fine textured structure, the height difference between the bottom of a depressed portion and the top of a raised portion adjacent to the depressed portion is 15 nm or more.

The area percentage of the region having such a fine textured structure must be increased to have the surface contact resistance characteristics for a longer time.

The present inventors found that when at least the top of a fine textured structure of steel has a triangular pyramid structure, the surface contact resistance of the steel is further decreased and rarely increases in the operating environment, and the steel has a low contact resistance for a long time and improved durability.

The present inventors also found that, in addition to the fine textured structure, trapezoidal projection structures on the order of micrometers provided on a steel surface can significantly suppress an increase in contact resistance due to sliding during the processing of the steel.

The present invention is based on these findings and has the following characteristics.

[1] A stainless steel having a low surface contact resistance for fuel cell separators and a Cr content in the range of 16 to 40 mass %, wherein the stainless steel includes a region having a fine textured structure on its surface, the area percentage of the region being 50% or more. The region having a fine textured structure is a region which has a structure having depressed portions and raised potions at an average interval between the depressed portions or the raised portions of 20 nm or more and 150 nm or less when observed with a scanning electron microscope.

[2] The stainless steel having a low surface contact resistance for fuel cell separators according to [1], wherein the area percentage is 80% or more.

[3] The stainless steel having a low surface contact resistance for fuel cell separators according to [1] or [2], wherein the raised portions of the fine textured structure have a triangular pyramidal top having an average angle of 80 degrees or more and 100 degrees or less.

[4] The stainless steel having a low surface contact resistance for fuel cell separators according to [3], wherein the triangular pyramidal tops of the raised portions are disposed at an average interval of 100 nm or less.

[5] The stainless steel having a low surface contact resistance for fuel cell separators according to [3] or [4], wherein the stainless steel includes trapezoidal projection structures having an average height of 0.15 μm or more and 2 μm or less and an average diameter of 3 μm or more and 50 μm or less, the area percentage of the dispersed trapezoidal projection structures being 5% or more and 30% or less.

[6] The stainless steel having a low surface contact resistance for fuel cell separators according to [5], wherein the trapezoidal projection structures correspond to crystal grains of the stainless steel.

Advantageous Effects of Invention

The present invention provides a stainless steel having a low surface contact resistance for fuel cell separators. A stainless steel for fuel cell separators according to the present invention has good surface contact resistance characteristics. A stainless steel for fuel cell separators according to the present invention can maintain the surface contact resistance for a long time and is of much practical use. An increase in the contact resistance of a stainless steel for fuel cell separators according to the present invention can be minimized even after processing, such as press working, of the stainless steel. A stainless steel according to the present invention can be used as a separator in place of a known expensive carbon or gold coating to manufacture inexpensive fuel cells and thereby promote the spread of fuel cells.

DESCRIPTION OF EMBODIMENTS

Figure 1:
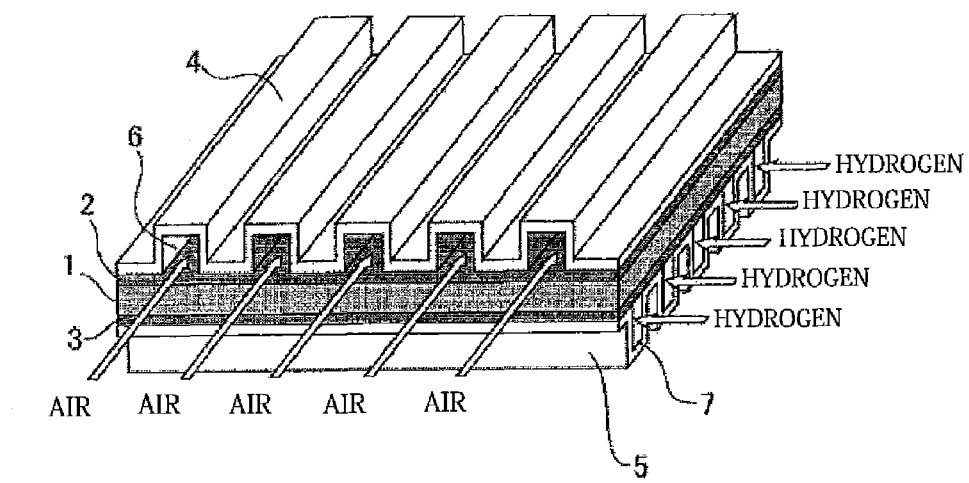
FIG. 1 is a schematic view showing the basic structure of a fuel cell.

The present invention will be further described below in detail.

First, a stainless steel directed to in the present invention will be described below.

A stainless steel according to the present invention used as a material is not limited to a particular type of steel, provided that the stainless steel has required corrosion resistance in the operating environment of fuel cells. In order to have essential corrosion resistance, the Cr content must be 16 mass % or more. A Cr content of less than 16 mass % results in a separator having insufficient durability for long-term use. The Cr content is preferably 18 mass % or more. A Cr content of more than 40 mass % results in an excessively increased cost of the stainless steel. Thus, the Cr content is 40 mass % or less.

The other components and their concentrations are not particularly limited. A stainless steel according to the present invention may contain the following elements sufficient for practical use or so as to improve its corrosion resistance.

C: 0.03% or Less

C combines with chromium in the stainless steel and precipitates chromium carbide in grain boundaries, thus C may adversely affect the corrosion resistance of the stainless steel. Thus, the C content is preferably lowered. The corrosion resistance does not significantly deteriorate at a C content of 0.03% or less. Thus, the C content is preferably 0.03% or less, more preferably 0.015% or less.

Si: 1.0% or Less

Si is an effective element for deoxidation and is added to the stainless steel in a smelting process. The addition of an excessive amount of Si, however, causes hardening of a stainless steel sheet and may decrease the ductility. Thus, the Si content is preferably 1.0% or less.

Mn: 1.0% or Less

Combining with incidental sulfur, Mn is an effective element for reducing sulfur dissolved as a solid-solute in the stainless steel, suppressing segregation of sulfur at grain boundaries, and preventing cracking of a steel sheet during hot rolling. However, the addition of more than 1.0% Mn does not significantly improve these effects. Such an excessive addition increases the cost of the stainless steel. Thus, the Mn content is preferably 1.0% or less.

S: 0.01% or Less

S combines with manganese and forms manganese sulfide, thereby deteriorating the corrosion resistance. Thus, the S content is preferably lowered. A S content of 0.01% or less does not significantly deteriorate the corrosion resistance. Thus, the S content is preferably 0.01% or less.

P: 0.05% or Less

Since P deteriorates the ductility of the stainless steel, it is desirable to reduce P. However, a P content of 0.05% or less does not significantly deteriorate the ductility of the stainless steel. Thus, the P content is preferably 0.05% or less.

Al: 0.20% or Less

Al is used as a deoxidation element. However, an excessively high Al content results in low ductility of the stainless steel. Thus, the Al content is preferably 0.20% or less.

N: 0.03% or Less

N is an effective element for suppressing the local corrosion, such as crevice corrosion, of the stainless steel. However, the addition of more than 0.03% N to the stainless steel in a smelting process takes a long time and reduces the productivity of the stainless steel and may deteriorate steel formability. Thus, the N content is preferably 0.03% or less.

At Least One of Ni: 20% or Less, Cu: 0.6% or Less, and Mo: 2.5% or Less

Ni: 20% or Less

Ni is an element that stabilizes an austenite phase and is added in the manufacture of an austenitic stainless steel. A Ni content of more than 20% results in an increased cost of the stainless steel due to excessive consumption of Ni. Thus, the Ni content is preferably 20% or less.

Cu: 0.6% or Less

Cu is an effective element for improving the corrosion resistance of the stainless steel. However, a Cu content of more than 0.6% may result in poor hot workability and may cause low productivity. Further, the addition of an excessive amount of Cu increases the cost of the stainless steel. Thus, the Cu content is preferably 0.6% or less.

Mo: 2.5% or Less

Mo is an effective element for suppressing the local corrosion, such as crevice corrosion, of the stainless steel. Thus, the addition of Mo is effective in the case where the stainless steel is used in a severe environment. However, a Mo content of more than 2.5% may result in embrittlement of the stainless steel, low productivity, and an increased cost of the stainless steel due to excessive consumption of Mo. Thus, the Mo content is preferably 2.5% or less.

Total Nb, Ti, and/or Zr Content of 1.0% or Less

In addition to above described elements, a stainless steel according to the present invention may contain at least one of Nb, Ti, and Zr to improve the intergranular corrosion resistance. However, the total Nb, Ti, and Zr content of more than 1.0% may result in low ductility. Further, in order to avoid an increase in cost due to the addition of these elements, the total Ti, Nb, and Zr content is preferably 1.0% or less, when these elements are added.

The remainder are Fe and incidental impurities.

Next, the characteristics necessary for a stainless steel for separators according to the present invention will be described below. A stainless steel according to the present invention includes a region having a fine textured structure that has an average interval between depressed portions or raised portions (average distance between fine asperities) of 20 nm or more and 150 nm or less (hereinafter also referred to simply as a "region having a fine textured structure") on its surface when observed with a scanning electron microscope (hereinafter also referred to as SEM). The area percentage of the region having a fine textured structure is 50% or more, preferably 80% or more. In the textured structure, the height difference between the bottom of a depressed portion and the top of a raised portion adjacent to the depressed portion is 15 nm or more. An above defined average interval above its upper limit or an above defined area percentage below its lower limit results in an insufficient decrease in contact resistance of the stainless steel. This is probably because of a decreasing number of contact points. An average interval of less than 20 nm is undesirable in terms of durability. In a durability test for estimating durability conducted in a simulated operating environment of fuel cells, it was found that foreign matter was formed over time on the surface of stainless steel and increased the contact resistance of the stainless steel. This is probably because when a textured structure is excessively fine the contact resistance is susceptible to foreign matter.

Figure 8:
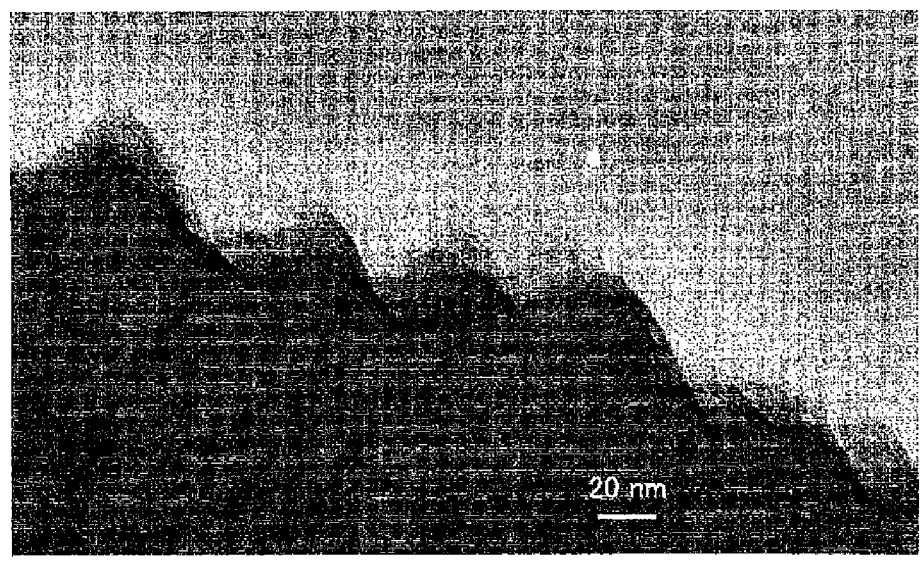
FIG. 8 is a picture showing a transmission electron microscope observation result of a cross section of a fine textured structure of SUS 443CT having triangular pyramidal raised portions according to Example 20 of the present invention.

The durability of the stainless steel is further improved when the raised portions of the fine textured structure have a triangular pyramidal top having an average angle of 80 degrees or more and 100 degrees or less. The average angle refers to the average of the angles at the tops of three planes forming the top of the triangular pyramid. In the present invention, the three planes are generally corresponding to cubic crystal 110 planes. In such a case, the angles in the three planes are approximately 90 degrees, and the average angle is approximately 90 degrees (=(90+90+90)/3). The top of the triangular pyramid shape is not necessarily to be sharpen at the atomic level. FIG. 8 shows an example of triangular pyramidal projections in a cross section of a stainless steel.

The advantage of the triangular pyramid structure at the top of each raised portion is probably as follows, although the present invention is not limited to the following mechanism.

(1) An oxidized layer having a thickness of several nanometers is formed on a stainless steel. Although being thin, the oxidized layer can be a factor which increases the contact resistance of the stainless steel. Thus, it is desirable that such an oxidized layer be broken when surface of the stainless steel comes into contact with, for example, an opposing carbon paper in a fuel cell. In particular, after a durability test, the thickness or composition of the oxidized layer may be changed, and the resistance may be increased. The triangular pyramid structure at the top of the projection has a small curvature radius. This increases the contact pressure and facilitates the breakage of the oxide film. Thus, it is considered that after the durability test the contact resistance of the stainless steel is lowered.

(2) As described above, foreign matter is formed over time on the stainless steel in the operating environment and increases the contact resistance of the stainless steel. When the top of the projection has the triangular pyramid structure, the contact resistance is insusceptible to the foreign matter. Even in the presence of some amount of foreign matter, the increase in contact resistance of the stainless steel is suppressed as there is the triangular pyramid portion which locally maintains the contact pressure. When the average interval between the tops of the triangular pyramid portions is 150 nm or less, preferably 100 nm or less, this results in further improved performance of the stainless steel.

Figure 2:
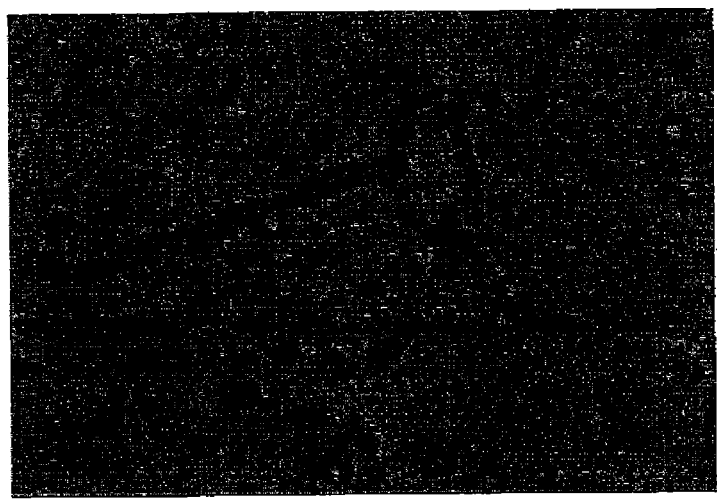
FIG. 2 is a picture showing the result of a scanning electron microscope observation of a surface of SUS 304L on which a region having a fine textured structure is formed according to Example 2 of the present invention.
Figure 3:
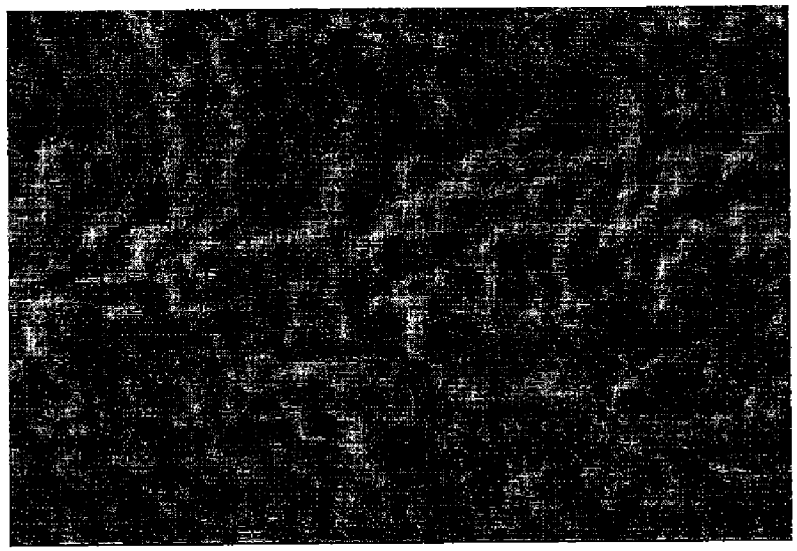
FIG. 3 is a picture showing the result of a scanning electron microscope observation of a surface of SUS 443CT on which a region having a fine textured structure is formed according to Example 11 of the present invention.
Figure 4:
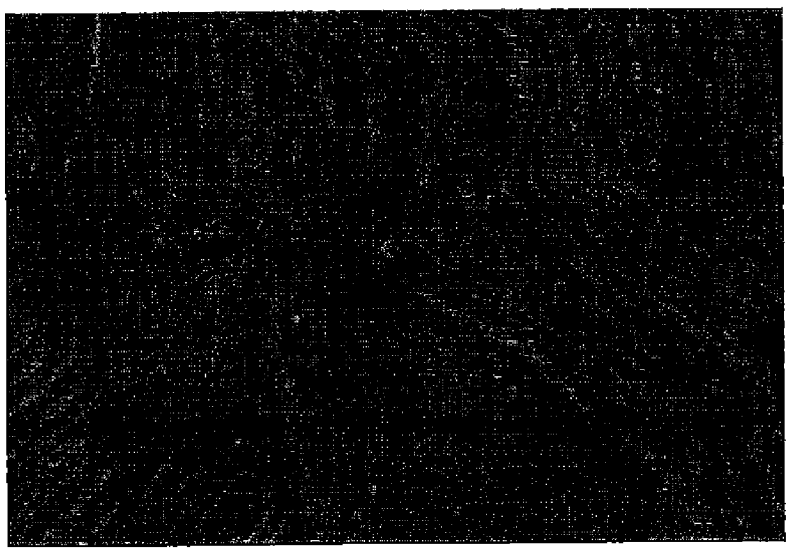
FIG. 4 is a picture showing the result of a scanning electron microscope observation of an untreated surface of SUS 304L on which no region having a fine textured structure is formed.

The fine textured structure as described above is observed with a scanning electron microscope (SEM). The SEM used to observe the fine textured structure is, but not limited to, an apparatus that can provide clear secondary electron images at an incident electron accelerating voltage of 5 kV or less, desirably 1 kV or less, and at a magnification of tens of thousands of times. The average spacing of fine asperities can be determined from such a secondary electron image. For example, the number of fine projections or depressed portions crossing a line of a given length is counted with such a SEM, and the length is divided by the number. In the case of triangular pyramidal tops, the number of triangular pyramidal tops in a given area is counted. The average interval between projections is simply calculated by $1000/(N^{0.5})$ nm, wherein N denotes the number of tops per square micrometer. Alternatively, the distance between raised portions and the peak-to-peak distance may be determined from a Fourier-transformed image. The average of the angles at the tops of three planes forming the top of the triangular pyramid is 80 degrees or more and 100 degrees or less. Here, the angles at the tops of three planes are angles viewed in a direction perpendicular to the corresponding plane. Examples of SEM observation results are shown as follows. FIG. 2 is a SEM observation of a surface of SUS 304L on which a region having a fine textured structure is formed according to an example of the present invention described below. FIG. 3 is a scanning electron microscope observation of a surface of SUS 443CT on which a region having a fine textured structure is formed according to an example of the present invention described below. The average spacing of fine asperities was 25 nm in FIG. 2 and 150 nm in FIG. 3. For comparison purposes, FIG. 4 is a scanning electron microscope observation of a surface of SUS 304L on which no region having a fine textured structure is formed.

Figure 7:
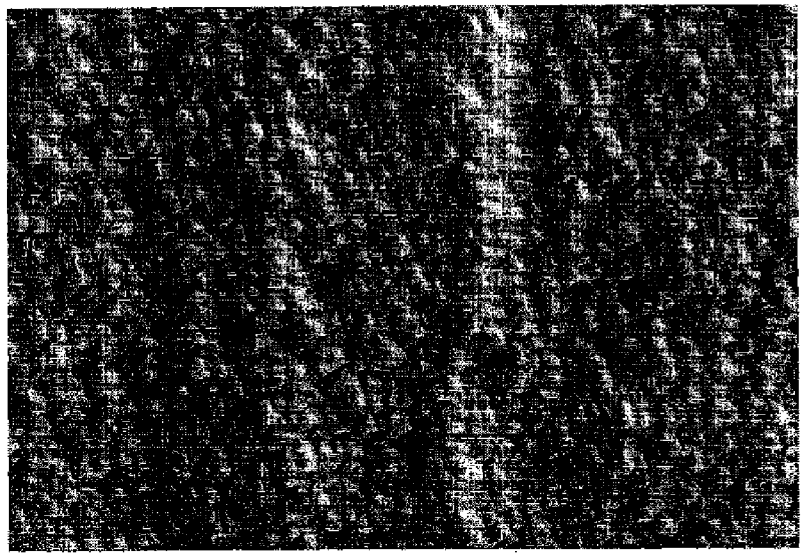
FIG. 7 is a picture showing a scanning electron microscope observation result of a surface of a fine textured structure of SUS 443CT having triangular pyramidal raised portions according to Example 20 of the present invention.
Figure 7:
Figure 7:
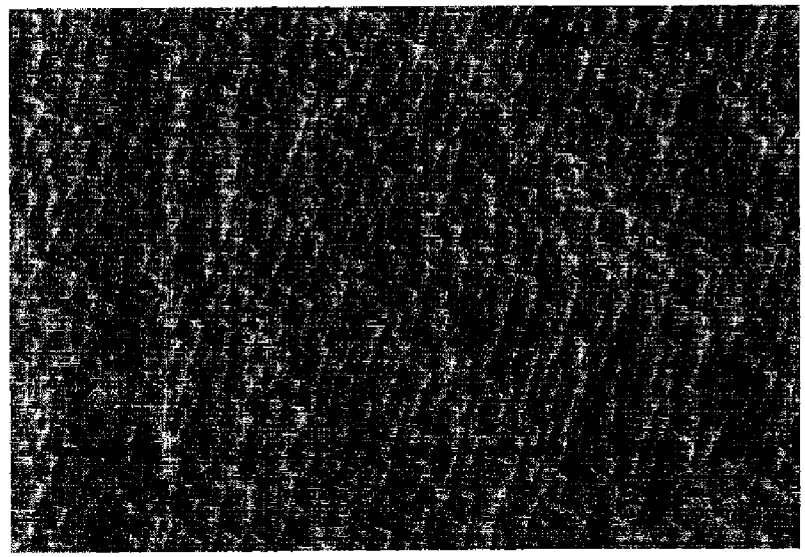
Figure 7:

FIG. 7 is a scanning electron microscope observation of a surface of SUS 443CT on which a region having a textured structure that includes raised portions of a triangular pyramid shape is formed according to an example of the present invention described below. In particular, FIG. 7 shows that a textured structure that includes many raised portions of a triangular pyramid shape having a sharp edge is formed on the surface, unlike FIGS. 2 and 3. In the upper figure of FIG. 7, the number of raised portions is 150 per square micrometer. This corresponds to a projection average interval of 82 nm. In the present invention, the region having a fine textured structure does not include a step structure formed by annealing, a projection due to a precipitate on the surface, and a hollow in a grain boundary or crystal grain formed by heat treatment as shown in FIG. 4.

The average interval between depressed portions or raised portions is required to be 20 nm or more and 150 nm or less, preferably 120 nm or less, more preferably 100 nm or less. The relationship among the average spacing of fine asperities, the area percentage of a region having a fine textured structure, surface contact resistance, and surface contact resistance after a durability test was studied. The area percentage can be determined through SEM observation and was determined in a 100 μm square. A region having a fine textured structure is shown as a light part in contrast because of increased secondary electron emission. The area percentage of a region having a fine textured structure was determined through the binary conversion of a secondary electron image using commercially available software.

The surface contact resistance and the surface contact resistance after a durability test were measured while a carbon paper CP120 manufactured by Toray Industries, Inc. was in contact with a steel at a load of 20 kgf/cm$^2$.

Figure 5:
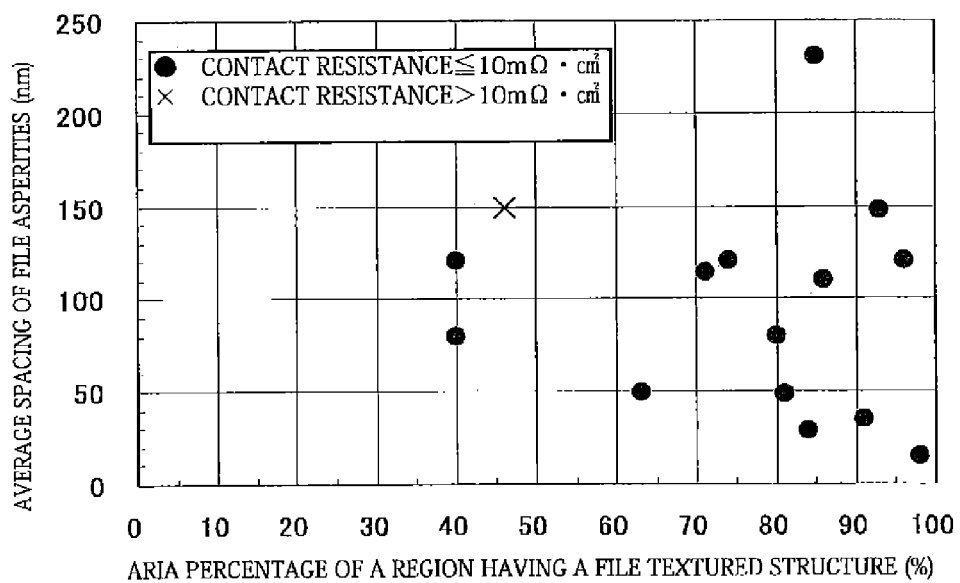
FIG. 5 is a graph showing the relationship among the average spacing of fine asperities, the area percentage of a region having a fine textured structure, and the surface contact resistance according to the present invention.
Figure 6:
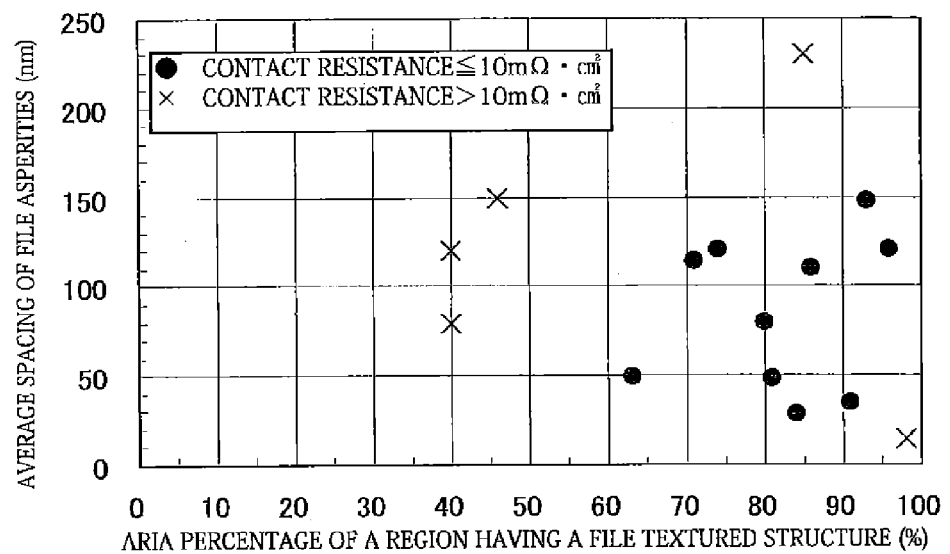
FIG. 6 is a graph showing the relationship among the average spacing of fine asperities, the area percentage of a region having a fine textured structure, and the surface contact resistance after a durability test according to the present invention.

In a durability test, a sample was immersed in a sulfuric acid solution at pH 3 at 0.6 V versus a Ag—AgCl reference electrode at room temperature for 24 hours. FIG. 5 shows the relationship between the average spacing of fine asperities, the area percentage of a region having a fine textured structure, and the surface contact resistance (before the durability test) based on the results thus obtained. From FIG. 5, it was found that the surface contact resistance was achieved to be as low as 10 mΩ·cm$^2$ or less when the area percentage of a region having a fine textured structure was 50% or more and the average spacing of fine asperities ranged from 15 to 230 nm. FIG. 6 shows the relationship between the average spacing of fine asperities, the area percentage of a region having a fine textured structure, and the surface contact resistance after the durability test. From FIG. 6, it was found that the surface contact resistance after the durability test was also 10 mΩ·cm$^2$ or less when the area percentage of a region having a fine textured structure was 50% or more and the average spacing of fine asperities ranged from 20 to 150 nm. The area percentage of a region having a fine textured structure may be determined using another method. For example, in the case that the fine textured structure is formed only in crystals having a particular crystal orientation, the area is efficiently measured in each of crystal grains.

Thus, in order to achieve a sufficiently low surface contact resistance (10 mΩ·cm$^2$ or less) of a stainless steel, it is necessary to provide 50% or more of the stainless steel surface with a region having a fine textured structure that includes fine asperities at an average interval of 20 nm or more and 150 nm or less. When the area percentage of the region having a fine textured structure is less than 50%, this results in an insufficient effect of increasing the number of contact points with an electrode by fine asperities of the stainless steel, and the stainless steel does not have a sufficiently low surface contact resistance (10 mΩ·cm$^2$ or less).

Furthermore, in order to maintain the surface contact resistance for a long time in the operating environment of fuel cells, that is, in order to suppress an increase in surface contact resistance in the operating environment of fuel cells, the area percentage of the region having a fine textured structure is 50% or more as described below. Although the reason for this is not clear, the following is a possible reason for this. In the operating environment, the electrical conductivity of a thin oxidized layer on a steel surface decreases because of an increase in the thickness of the oxidized layer or variations in the composition of the oxidized layer. The influence of this effect on surface contact resistance is probably greater in a smooth surface without fine asperities than in a surface having fine asperities. Thus, in order to maintain a low surface contact resistance in the operating environment, the smooth surface must be decreased as far as possible, and the area percentage of the surface having fine asperities must be increased.

In the examples described above, the fine textured structure has a fine granular or gently sloping shape ([FIG. 2], [FIG. 3]), and a fine textured structure that includes raised portions having a triangular pyramidal top ([FIG. 7]) further improves the durability of the stainless steel. The increase in contact resistance of samples having raised portions at an average interval of 150 nm or less due to the above described durability test for 24 hours was significantly lower in samples having raised portions of a triangular pyramid shape than samples not having raised portions of a triangular pyramid shape (2.0 mΩ·cm$^2$ or more). The initial contact resistance was discerned independent of the profile of raised portions.

The present inventors also studied the relationship between the surface profile observed on the order of micrometers, contact resistance, contact resistance after a durability test, and contact resistance after a sliding test, on a surface having a fine textured structure described above. Such a surface profile can be easily measured with a confocal laser microscope or an optical interferotype profilometer. [FIG. 9] to [FIG. 12] show the surface profiles of a ferritic stainless steel SUS 443CT (a ferritic stainless steel classified into JIS standard SUS 443J1, for example, "JFE 443CT" manufactured by JFE Steel Corp.) measured with an optical interferotype profilometer. The field size is 0.35 mm×0.26 mm. The resolving power is 0.55 μm.

Figure 9:
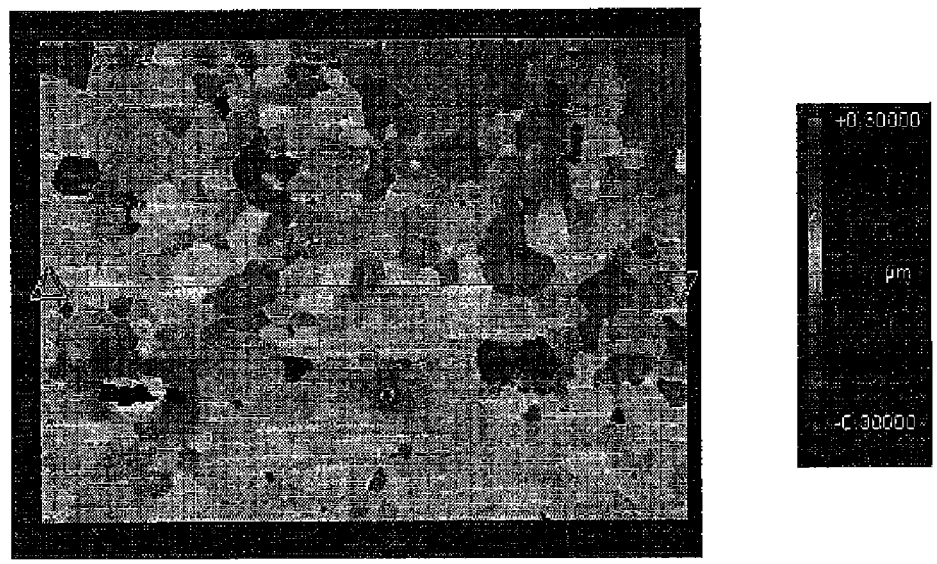
FIG. 9 is a picture showing a surface profile measurement result for a surface having trapezoidal projection structures of SUS 443CT according to Example 36 of the present invention.
Figure 10:
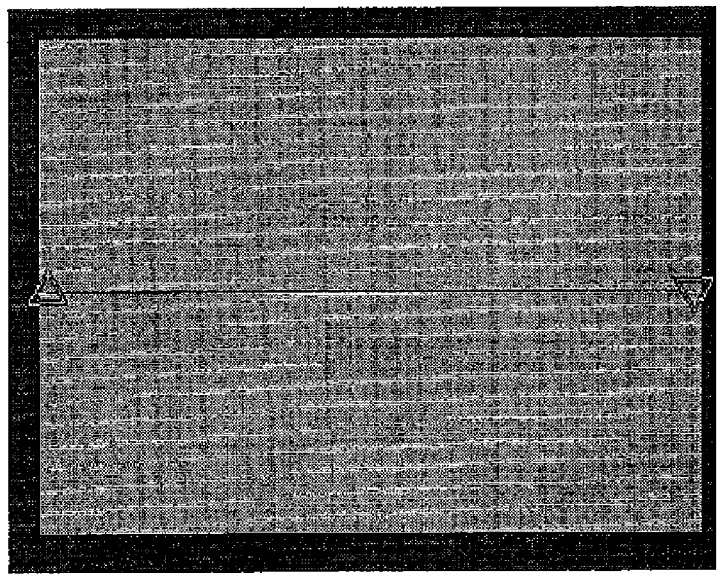
FIG. 10 is a picture showing a surface profile measurement result for a polished steel sheet surface of SUS 443CT having no trapezoidal projection structures.
Figure 10:
Figure 11:
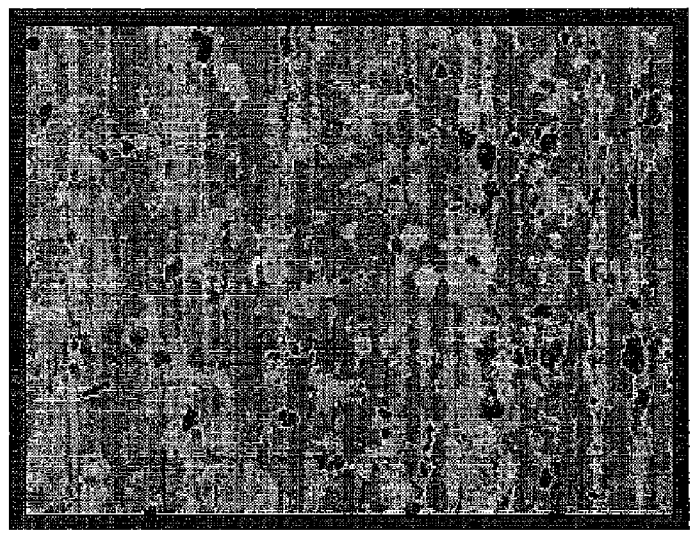
FIG. 11 is a picture showing a surface profile measurement result for a foil surface of SUS 443CT having trapezoidal projection structures according to Example 20 of the present invention.
Figure 11:
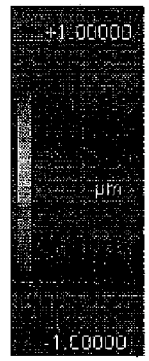
Figure 12:
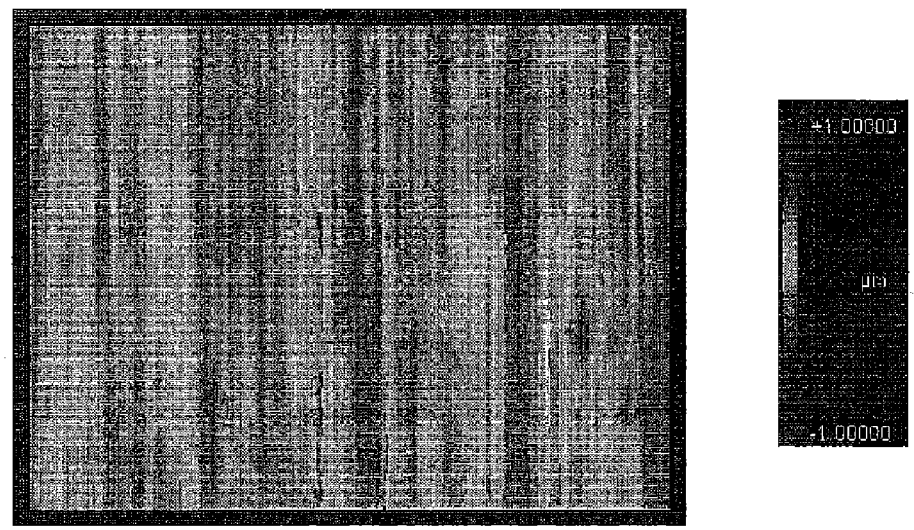
FIG. 12 is a picture showing a surface profile measurement result of a foil surface of SUS 443CT having no trapezoidal projection structures according to Example 26.

It was found that although examples of the present invention have trapezoidal projection structures in [FIG. 9] and [FIG. 11], comparative examples of the present invention have no trapezoidal projection structures in [FIG. 10] and [FIG. 12]. [FIG. 9] shows a polished stainless steel subjected to a treatment and clearly shows the presence of trapezoidal projection structures. [FIG. 11] shows a stainless steel foil subjected to a treatment and shows the presence of trapezoidal projection structures overlapping asperities on the streaks in the rolling direction formed during the formation of the foil. A surface of these examples after the profile measurement was examined in the same field with SEM and by an electron backscatter diffraction scattering (EBSD) method. It was found that the trapezoidal projection structures in [FIG. 9] and [FIG. 11] corresponded to crystal grains on the stainless steel surface. The average height of the trapezoidal projection structures, the average diameter of the trapezoidal projection structures viewed in a direction perpendicular to the surface, and the area percentage of the trapezoidal projection structures were calculated from the obtained data.

The contact resistance and the contact resistance after a durability test were measured while a carbon paper CP120 manufactured by Toray Industries, Inc. was in contact with a steel at a load of 20 kgf/cm$^2$. The contact resistance was also measured using the same method after a sliding test.

The following findings were obtained from these results.

The formation of a fine structure in a predetermined range on a surface results in a low contact resistance of 10 mΩ·cm$^2$ or less, as described above.

When the trapezoidal projection structures have an average height of 0.15 μm or more and 2 μm or less and an average diameter of 3 μm or more and 50 μm or less when viewed from the top, and the area percentage of the trapezoidal projection structures is 5% or more and 30% or less, the contact resistance of the stainless steel is as low as 10 mΩ·cm$^2$ or less even after the sliding test.

Sliding of an indenter (die) on a surface of a steel sheet causes damage to fine textured structures on the surface of the steel sheet. In the presence of trapezoidal projection structures on the surface, the projections come into contact with the indenter (die) after the sliding test, and the damaged region is limited to the trapezoidal projection structures. Thus, it seems that most of the fine textured structures remain after the sliding test and maintain the low contact resistance. This effect requires the height of 0.15 μm or more. Excessively high trapezoidal projection structures take a longer time and a higher cost to form. Thus, the height of the trapezoidal projection structures is preferably 2 μm or less. The area percentage of the trapezoidal projection structures is 5% or more and 30% or less. When the area percentage of the trapezoidal projection structures is outside this range, the contact resistance is unfavorably increased after processing. When the area percentage is less than 5%, the trapezoidal projection structures are easily scraped by sliding, and the area having no fine textured structure increases. When the area percentage is more than 30%, fine textured structures on the surface of the trapezoidal projection structures are easily scraped by sliding, and the contact resistance increases. Localized trapezoidal projection structures have little effect. It is desirable that trapezoidal projection structures be uniformly dispersed on the surface.

Figure 13:
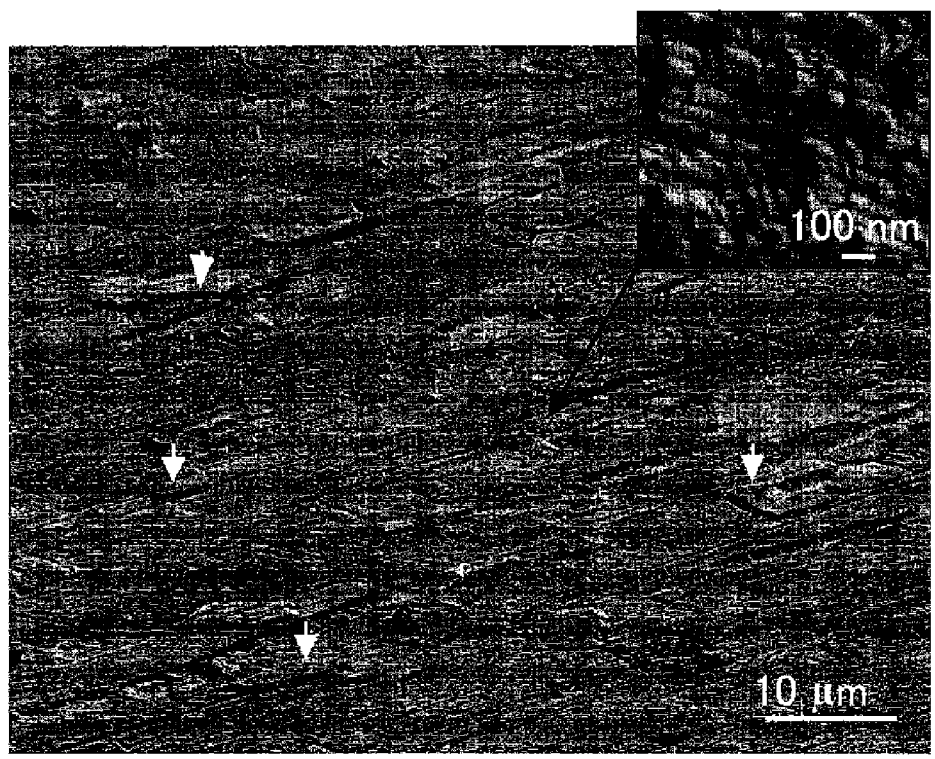
FIG. 13 is a picture showing a scanning electron microscope observation result of a surface of SUS 443CT having trapezoidal projection structures according to Example 19 viewed at an oblique angle. The trapezoidal projection structures are indicated by an arrow. The high-magnification observation shows triangular pyramidal fine projection structures on the surface.

When the average diameter of the trapezoidal projection structures is less than 3 μm, the trapezoidal projection structures collapse easily by contact with a die. When the average diameter of the trapezoidal projection structures is more than 50 μm, the contact area increases unfavorably. Thus, it is desirable that the average diameter of the trapezoidal projection structures be 3 μm or more and 50 μm or less. The term "trapezoidal projection structures", as used herein, refers to regions that are higher than their surroundings and have a certain area. The trapezoidal projection structures can be quantitatively observed using the profile measurement method as described above. The trapezoidal projection structures can be qualitatively observed with SEM while a sample is tilted. [FIG. 13] shows an example.

The following is a specific example. The surface profile is measured in a field of 0.35 mm×0.26 mm with an optical interferotype profilometer. In this field, a trapezoidal projection structure is a flat portion having a length of 2 μm or more on at least one of five straight lines being set for measurement parallel to the 0.35-mm long side and having a height at least 0.05 μm higher than left and right portions adjacent to the trapezoidal projection structure. The top of the trapezoidal projection structure is not necessarily parallel to the surface of the sample and is not necessarily a flat surface but may be a gently curved surface. Further, a fine textured structure may be situated on the top of the trapezoidal projection structure. The height of an individual trapezoidal projection structure is a difference between the average height of 10 points on a flat portion of the trapezoidal projection structure disposed on straight lines for measurement and the average height of 5 points on straight lines for measurement in left and right portions adjacent to the trapezoidal projection structure that have no trapezoidal projection structure. The average height is the average of the heights of all the trapezoidal projection structures disposed on the straight lines for measurement. The diameter of an individual trapezoidal projection structure is the length of a straight line projected on the surface of the sample corresponding to a flat portion of the trapezoidal projection structure disposed on the straight line. The average diameter of trapezoidal projection structures is the average of the diameters of all the trapezoidal projection structures disposed on the straight lines used for measurement. The area percentage is the ratio of the total diameter of trapezoidal projection structures (the total of the lengths of the tops of the flat portions of the trapezoidal projection structures) disposed on the straight lines for measurement to the length of the lines for measurement (0.35 mm×5). If three trapezoidal projection structures in the observation field are disposed on five straight lines each having a length of 0.35 mm (350 μm) and have diameters (the lengths of the tops of the flat portions) of 20, 30, and 10 μm, the average diameter is 20 μm ((20+30+10)/3)), and the area percentage is 3.4% ((20+30+10)/(350×5)).

A method for manufacturing a stainless steel according to the present invention having a low surface contact resistance for fuel cell separators will be described below. The following are non-limiting suitable manufacturing conditions.

A slab having an appropriate composition is heated to a temperature of 1100° C. or more and is hot-rolled. The hot-rolled slab is annealed at a temperature in the range of 800° C. to 1100° C. and is repeatedly cold-rolled and annealed to form a stainless steel. The stainless steel sheet preferably has a thickness in the range of approximately 0.02 to 0.8 mm. The stainless steel sheet is then subjected to final annealing, and preferably further, electrolytic treatment, and acidizing. Aqueous sulfuric acid can be used in the electrolytic treatment. Immersion in a hydrofluoric acid solution can be used in the acidizing, for example. The formation and the adjustment of the area percentage of a region having a fine textured structure can be performed by changing the conditions (the concentration and type of the solution, temperature, and immersion time) for these treatments, in particular acidizing.

Raised portions of a triangular pyramid shape may be formed by any method. It is desirable to use the crystal orientation dependence of etching with an acidic solution because it can treat a wide area without using a complicated process (such as ion irradiation). The present inventors found that a triangular pyramid shape can be formed in a wide area on a surface by controlling the crystal orientation and the etching conditions. In a ferritic stainless steel, raised portions of a triangular pyramid shape composed of (001) micro facets can be formed of crystal grains, in which the orientation perpendicular to the surface is close to ND <111>, at a high density. Although the raised portions of a triangular pyramid shape may be formed of crystal facets having a different orientation, the number of raised portions is smaller in this case than in the case of crystal grains having the orientation close to ND <111>. Thus, rolling is performed such that the texture contains many crystal grains in which the orientation perpendicular to the surface is close to ND <111>. Such a texture can be easily observed by texture observation and by taking electron backscatter diffraction scattering (EBSD) images. It is desirable that the raised portions of a triangular pyramid shape composed of (001) micro facets be formed by reducing Fe in a pretreatment electrolyte solution or by immersion in a solution containing minimized amounts of nitric acid and Fe in hydrofluoric acid used for immersion for a predetermined period of time (for 5 mass % aqueous HF at 55° C., the time preferably ranges from 80 to 600 seconds).

The trapezoidal projection structures may be formed by any method. It is desirable to form the trapezoidal projection structures utilizing a difference in crystal orientation of crystal grains because this can obviate the need for an additional process, such as masking and etching. The fine textured structure on the surface described above can be formed in a relatively short period of time. The height difference in different crystal orientations increases with the treatment time because of a difference in etch rate in the different crystal orientations. Since the ND <001> plane is difficult to etch, grains having this crystal orientation form the trapezoidal projection structure. These can be controlled by changing acidizing conditions (the concentration and type of the solution, temperature, and immersion time). Under a certain solution condition, there is a minimum treatment time for the formation of the fine textured structure. There is also a minimum treatment time, which is longer than the former minimum treatment time, for the formation of the trapezoidal projection structure. There is also a maximum treatment time, after which the trapezoidal projection structure disappears. For 5 mass % aqueous HF at 55° C. described above, the treatment time preferably ranges from 80 to 450 seconds in terms of the height of the trapezoidal projection structure. The trapezoidal projection structure disappeared when the treatment time was 600 seconds. Since the surface profile is easy to be measured as described above, on the basis of the indications according to the present invention, the treatment conditions can be determined by measuring the surface profile without undue consideration.

Example 1

A commercially available austenitic stainless steel SUS 304L having a Cr content of 18.1 mass % and a commercially available ferritic stainless steel 443CT having a Cr content of 21.1 mass % were repeatedly subjected to cold rolling, annealing, and pickling, thus yielding stainless steel sheets having thickness of 0.2 mm.

The stainless steel sheet was then annealed and was subjected to electrolytic treatment and acidizing, which was immersion in a pickling solution, under the conditions shown in Table 1. The electrolytic treatment was conducted using an electrolyte solution containing iron (II) sulfate in an amount corresponding to 1 g/L of iron ions dissolved in 3 mass % aqueous sulfuric acid with alternating current at an electric current density of 5 A/dm$^2$ for 4.5 seconds. For comparison purposes, some samples were not subjected to electrolytic treatment and acidizing, which was immersion in a pickling solution, and some samples were subjected only to the electrolytic treatment. The stainless steel thus obtained was subjected to the measurement of surface contact resistance and surface observation using SEM (SUPRA 55VP manufactured by Carl Zeiss).

The surface profile of a region having a fine textured structure was determined from a secondary electron image taken with a chamber detector at an accelerating voltage of 0.5 kV and at a magnification in the range of 20,000 to 50,000. More specifically, five separated straight lines each having a length of 1 μm were drawn in a certain direction at five positions in the visual field. The average spacing of fine asperities was calculated by dividing 5 μm by the total number of fine projections crossing the straight lines. The area percentage of the region having a fine textured structure was calculated from an image taken with an inlens detector at an accelerating voltage of 0.5 kV. The area of a bright region having fine asperities was calculated through the binary conversion of a secondary electron image using commercially available software (Photoshop).

The surface contact resistance was measured while a carbon paper CP120 manufactured by Toray Industries, Inc. was in contact with the steel at a load of 20 kgf/cm$^2$. After the measurement of the surface contact resistance, samples having a low surface contact resistance were further subjected to the measurement of surface contact resistance after a durability test. In the durability test, a sample was immersed in a sulfuric acid solution at pH 3, to which sodium fluoride was added such that the concentration of fluoride ions was 0.1 ppm, at 0.6 V versus a Ag—AgCl reference electrode at 80° C. for 24 hours. The surface contact resistance was measured using the method described above. An increase in surface contact resistance due to the durability test (surface contact resistance after the durability test−surface contact resistance before the durability test) was calculated. Table 1 lists the average spacing of fine asperities, the area percentage of the region having a fine textured structure, the surface contact resistance before and after the durability test, and an increase in surface contact resistance due to the durability test.

TABLE 1

| No. | Type of steel | Electrolysis in sulfuric acid Solution | Immersion in acid Solution | Time (sec) | Area percentage of region having fine textured structure (%) | Average spacing of fine asperties (nm) |
|---|---|---|---|---|---|---|
| 1 | 304L | 3% H$_2$SO$_4$ 1 g/L Fe | 5% HF-2% HNO$_3$ 55° C. | 150 | 98 | 15 |
| 2 | 304L | | 5% HF-1% HNO$_3$ 55° C. | 150 | 91 | 34 |
| 3 | 304L | | 5% HF 55° C. | 120 | 81 | 48 |
| 4 | 304L | | 5% HF 55° C. | 60 | 63 | 49 |
| 5 | 443CT | 3% H$_2$SO$_4$ 1 g/L Fe | 5% HF-2% HNO$_3$ 55° C. | 40 | 40 | 80 |
| 6 | 443CT | | | 90 | 71 | 114 |
| 7 | 443CT | | | 120 | 74 | 120 |
| 8 | 443CT | | 5% HF-4% HNO$_3$ | 200 | 84 | 28 |
| 9 | 443CT | | 5% HF- | 40 | 80 | 79 |
| 10 | 443CT | | 1% HNO$_3$ | 90 | 86 | 110 |
| 11 | 443CT | | 55° C. | 120 | 96 | 120 |
| 12 | 443CT | | | 200 | 93 | 148 |
| 13 | 443CT | | | 500 | 85 | 230 |
| 14 | 443CT | | 5% HF 55° C. | 10 | 40 | 120 |
| 15 | 444CT | | | 20 | 46 | 150 |

| No. | Contact resistance (mΩ · cm$^2$) 20 kgf per side | Contact resistance after durability test (mΩ · cm$^2$) 20 kgf per side | Increase in contact resistance due to durability test (mΩ · cm$^2$) 20 kgf per side | Note |
|---|---|---|---|---|
| 1 | 5.2 | 36.0 | 30.8 | Comparative example |
| 2 | 4.3 | 7.5 | 3.2 | Example |

TABLE 1-continued

| | | | | |
|---|---|---|---|---|
| 3 | 4.1 | 7.3 | 3.2 | Example |
| 4 | 5.3 | 9.8 | 4.5 | Example |
| 5 | 7.1 | 18.0 | 10.9 | Comparative example |
| 6 | 5.0 | 9.2 | 4.2 | Example |
| 7 | 5.2 | 9.5 | 4.3 | Example |
| 8 | 4.0 | 5.5 | 1.5 | Example |
| 9 | 4.3 | 7.4 | 3.1 | Example |
| 10 | 4.1 | 7.0 | 2.9 | Example |
| 11 | 4.0 | 6.9 | 2.9 | Example |
| 12 | 4.3 | 8.1 | 4.2 | Example |
| 13 | 5.7 | 16.0 | 10.3 | Comparative example |
| 14 | 7.8 | 42.0 | 34.2 | Comparative example |
| 15 | 10.5 | 48.0 | 37.5 | Comparative example |

Table 1 shows that the examples in which the area percentage of the region having a fine textured structure was 50% or more and the average spacing of fine asperities was 20 nm or more and 150 nm or less had a surface contact resistance of 10 mΩ·cm$^2$ or less. The surface contact resistance after the durability test in the examples was also 10 mΩ·cm$^2$ or less. Thus, it is confirmed that the examples maintained a low surface contact resistance even in the long-term operating environment and had good surface contact resistance maintenance characteristics.

Example 2

A commercially available austenitic stainless steel SUS 304L having a Cr content of 18.1 mass % and a commercially available ferritic stainless steel SUS 443CT having a Cr content of 21.1 mass % were repeatedly subjected to cold rolling, annealing, and pickling, thus yielding stainless steel sheets having thickness of 0.2 mm. In some samples, a sheet having a thickness of 2 mm was used. The sheet having a thickness of 2 mm was subjected to mirror polishing using alumina buffing before the treatment. The samples were treated under conditions shown in Table 2. An electrolytic treatment was performed in 3 mass % aqueous sulfuric acid. An acid immersion treatment was performed in 5 mass % hydrofluoric acid, to which, depending on the condition, iron (II) sulfate in an amount corresponding to 3 g/L of iron ions was added. Further, depending on the condition, the acid immersion treatment was performed in 10 mass % hydrochloric acid.

The stainless steel thus obtained was subjected to the measurement of contact resistance and the observation of a surface fine structure using SEM (SUPRA 55VP manufactured by Carl Zeiss). The profile of projection structures and the average interval between projections were determined from a secondary electron image taken with a chamber detector at an accelerating voltage of 0.5 kV and at a magnification in the range of 20,000 to 100,000. Whether a raised portion had a triangular pyramid shape was judged according to the presence of three straight lines extending from the center of the raised portion, which correspond to the sides of the triangular pyramid shape (see [FIG. 7]). In the measurement of the average interval, the number of raised portions of a triangular pyramid shape was counted in a 1 μm×1 μm observation field. The numbers of raised portions counted in three fields were averaged. The average interval between projections was calculated from the average number N of projections per square micrometers by $1000/N^{0.5}$ nm. Raised portions not having a triangular pyramid shape, such as granular raised portions, were also measured in the same manner.

The contact resistance was measured while a carbon paper CP120 manufactured by Toray Industries, Inc. was in contact with the steel at a load of 20 kgf/cm$^2$. After the measurement of the contact resistance, samples having a low contact resistance were further subjected to the measurement of contact resistance after a durability test. In the durability test, a sample was immersed in a sulfuric acid solution at pH 3, to which sodium fluoride was added such that the concentration of fluoride ions was 0.1 ppm, at 0.6 V versus a Ag—AgCl reference electrode at 80° C. for 500 hours. The contact resistance was measured using the method described above. Table 2 shows the results together with the sample preparation conditions.

TABLE 2

| | | | | | | Surface texture | |
|---|---|---|---|---|---|---|---|
| | | Electrolysis in sulfuric acid | | Immersion in acid | | Area percentage of region having fine textured | Profile of fine textured |
| No. | Type of steel | Solution | Electric current | Solution | Time (sec) | structure (%) | structure |
| 16 | 443CT | — | — | — | — | — | No projection |
| 17 | 443CT | 3% H$_2$SO$_4$ | Alternating current, electric current density 5 A/dm$^2$, 4.5 s | — | — | — | No projection |
| 18 | 443CT | 3% H$_2$SO$_4$ | Alternating current, electric current density 5 A/dm$^2$, 4.5 s | 5% HF 55° C. | 60 | 83 | Triangular pyramidal |

TABLE 2-continued

| No. | | | | | | | |
|---|---|---|---|---|---|---|---|
| 19 | 443CT | 3% H$_2$SO$_4$ | Alternating current, electric current density 5 A/dm$^2$, 4.5 s | 5% HF 55° C. | 120 | 83 | Triangular pyramidal |
| 20 | 443CT | 3% H$_2$SO$_4$ | Alternating current, electric current density 5 A/dm$^2$, 4.5 s | 5% HF 55° C. | 240 | 86 | Triangular pyramidal |
| 21 | 443CT | 3% H$_2$SO$_4$ | Alternating current, electric current density 5 A/dm$^2$, 4.5 s | 5% HF 55° C. | 600 | 94 | Triangular pyramidal |
| 22 | 443CT* | 3% H$_2$SO$_4$ | Alternating current, electric current density 5 A/dm$^2$, 4.5 s | 5% HF 55° C. | 1800 | 98 | Triangular pyramidal |
| 23 | 304L* | 3% H$_2$SO$_4$ | Alternating current, electric current density 5 A/dm$^2$, 4.5 s | 5% HF 55° C. | 1800 | 99 | Granular projection |
| 24 | 304L | 3% H$_2$SO$_4$ | Alternating current, electric current density 5 A/dm$^2$, 4.5 s | 5% HF 55° C. | 240 | 87 | Granular projection |
| 25 | 443CT | 3% H$_2$SO$_4$ | Direct current, electric current density 0.5 A/dm$^2$, 80 s | 5% HF 55° C. | 240 | 91 | Triangular pyramidal |
| 26 | 443CT | 3% H$_2$SO$_4$ | Direct current, electric current density 0.5 A/dm$^2$, 80 s | 5% HF 55° C. 3 g/L Fe | 240 | 78 | Granular projection |
| 27 | 443CT | — | | 10% hydrochloric acid 50° C. | 240 | 97 | Formation of pit |
| 28 | Au sheet | — | | — | — | — | — |

| No. | Surface texture: Average interval between raised portions (average interval between triangular pyramidal tops) (nm) | Contact resistance (mΩ·cm$^2$) 20 kgf per side | Contact resistance after 24 h durability test (mΩ·cm$^2$) 20 kgf per side | Increase in contact resistance due to 24 h durability test (mΩ·cm$^2$) 20 kgf per side | Contact resistance after 500 h durability test (mΩ·cm$^2$) 20 kgf per side | Increase in contact resistance due to 500 h durability test (mΩ·cm$^2$) 20 kgf per side | Note |
|---|---|---|---|---|---|---|---|
| 16 | — | 514 | — | — | — | — | Comparative example |
| 17 | — | 35.8 | — | — | — | — | Comparative example |
| 18 | 25 | 4.05 | 4.31 | 0.26 | 7.66 | 3.61 | Example |
| 19 | 50 | 4.28 | 4.42 | 0.14 | 6.36 | 2.08 | Example |
| 20 | 65 | 4.53 | 4.68 | 0.15 | 5.36 | 0.83 | Example |
| 21 | 145 | 5.45 | 5.80 | 0.35 | 9.02 | 3.57 | Example |
| 22 | 410 | 12.40 | 14.10 | 1.70 | 25.6 | 13.2 | Comparative example |
| 23 | 120 | 6.20 | 9.26 | 3.06 | 36.7 | 30.5 | Example |
| 24 | 30 | 5.91 | 9.85 | 3.94 | 45.1 | 39.2 | Example |
| 25 | 90 | 4.75 | 4.83 | 0.08 | 5.12 | 0.37 | Example |
| 26 | 250 | 8.92 | 23.76 | 14.84 | 30.1 | 21.2 | Comparative example |
| 27 | 145 | 10.3 | 21.1 | 10.80 | 186 | 175.7 | Comparative example |
| 28 | — | 4.00 | — | — | — | — | Reference example |

*sheet having a thickness of 2 mm

Table 2 shows that the initial contact resistance and the contact resistance after the durability test for 500 hours in the examples in which projections of a triangular pyramid shape were disposed on the surface at an average interval of 150 nm or less were 10 mΩ·cm$^2$ or less. Thus, the examples maintained a low contact resistance even in the long-term operating environment. In particular, the contact resistance after the durability test in the examples in which the average interval between raised portions was 100 nm or less was 8 mΩ·cm$^2$ or less. Thus, the examples had further improved durability.

The increase in contact resistance due to the durability test of a granular fine textured structure having substantially the same average interval between raised portions was greater than that of the examples having the fine textured structure of a triangular pyramid shape. Samples not having the fine textured structure but having a small pit structure outside the scope of the present invention had low durability and could not be used.

In this test, a stainless steel evaporated with Au was also tested for comparison, and its result is shown. The results for the examples are no different from the results for the stainless steel evaporated with Au. Thus, the examples are judged to have a very low contact resistance. The relationship between surface crystal orientation and the triangular pyramid shape was studied using the EBSD method in the present example. It was confirmed that the raised portions of a triangular pyramid shape were formed of three (100) facets of a bcc structure. Thus, the average angle at the top of the three facets is approximately 90 degrees.

Example 3

A ferritic stainless steel SUS 443CT of the same lot (lot A) as in the examples was repeatedly subjected to cold rolling, annealing, and pickling to produce a stainless steel sheet having a thickness of 0.2 mm. The rolling reduction or the annealing temperature was altered to produce foils of different textures (lots B to E). In order to prepare a sample having trapezoidal projection structures on its polished surface, a "JFE 443CT" cold-rolled steel sheet having a thickness of 1 mm was subjected to mirror polishing using alumina buffing to prepare a lot F. The samples were then treated under conditions shown in Table 3. An electrolytic treatment was performed in 3 mass % aqueous sulfuric acid. An acid immersion treatment was performed in 5 to 10 mass % hydrofluoric acid, to which, depending on the condition, iron (II) sulfate in an amount corresponding to 3 g/L of iron ions was added.

The stainless steel thus obtained was subjected to the measurement of contact resistance and the observation of a surface fine structure using SEM (SUPRA 55VP manufactured by Carl Zeiss) in the same manner as in Example 2. The surface profile was measured with an optical interfero-type profilometer Zygo (Canon Marketing Japan Inc.). The observation field was 0.35 mm×0.26 mm. The presence or absence of trapezoidal projection structures was determined. If present, the average height and average diameter of the trapezoidal projection structures were measured using the method described above.

The area percentage of the region of the trapezoidal projection structures was determined in each visual field. Table 3 shows the average of the area percentages in two visual fields. In foil samples, streaks of raised portions or oil pits in the rolling direction were regarded to be flat and were included in the measured area.

The contact resistance was measured while a carbon paper CP120 manufactured by Toray Industries, Inc. was in contact with the steel at a load of 20 kgf/cm$^2$. The samples were subjected to a sliding test. The contact resistance of a portion rubbed in the sliding test was measured in the same manner as described above. As the sliding test, a plate sliding test was adopted. A bead having a contact area 10 mm in width and 3 mm in length in the slide direction (the curvature at both ends in the slide direction was 4.5 mmR) was pressed against a steel sheet at a vertical load of 100 kgf. The steel sheet was drawn by 30 mm at a velocity of 100 cm/min without an oil. The samples were rated "⊚: double circle", "○: circle", "Δ: triangle", and "x: cross" in the case that the increase in contact resistance due to the sliding test was 1 mΩ·cm$^2$ or less, more than 1 mΩ·cm$^2$ and 3 mΩ·cm$^2$ or less, more than 3 mΩ·cm$^2$ and 10 mΩ·cm$^2$ or less, and more than 10 mΩ·cm$^2$, respectively. Table 3 shows the results together with the sample preparation conditions.

TABLE 3

| | | | | | | | Surface texture | | |
|---|---|---|---|---|---|---|---|---|---|
| | | | | Electrolysis in sulfuric acid | | Immersion in acid | | Area percentage of region having fine textured | Profile of fine | Average interval between raised portions (average interval between triangular |
| No. | Type of steel | Lot. | Solution | Electric current | Solution | Time (sec) | structure (%) | textured structure | pyramidal tops) (nm) |
| 18 | 443CT | A | 3% H$_2$SO$_4$ | Alternating current, electric current density 5 A/dm$^2$, 4.5 s | 5% HF 55° C. | 60 | 83 | Triangular pyramidal | 25 |
| 19 | 443CT | A | 3% H$_2$SO$_4$ | Alternating current, electric current density 5 A/dm$^2$, 4.5 s | 5% HF 55° C. | 120 | 83 | Triangular pyramidal | 50 |
| 20 | 443CT | A | 3% H$_2$SO$_4$ | Alternating current, electric current density 5 A/dm$^2$, 4.5 s | 5% HF 55° C. | 240 | 86 | Triangular pyramidal | 65 |
| 21 | 443CT | A | 3% H$_2$SO$_4$ | Alternating current, electric current density 5 A/dm$^2$, 4.5 s | 5% HF 55° C. | 600 | 94 | Triangular pyramidal | 145 |
| 26 | 443CT | A | 3% H$_2$SO$_4$ | Direct current, electric current density 0.5 A/dm$^2$, 80 s | 5% HF 55° C. 3 g/L Fe | 240 | 78 | Granular projection | 250 |
| 29 | 443CT | A | 3% H$_2$SO$_4$ | Alternating current, electric current density 5 A/dm$^2$, 4.5 s | 5% HF 55° C. | 80 | 83 | Triangular pyramidal | 32 |
| 30 | 443CT | A | 3% H$_2$SO$_4$ | Alternating current, electric current density 5 A/dm$^2$, 4.5 s | 5% HF 55° C. | 300 | 87 | Triangular pyramidal | 87 |
| 31 | 443CT | A | 3% H$_2$SO$_4$ | Alternating current, electric current density 5 A/dm$^2$, 4.5 s | 5% HF 55° C. | 450 | 90 | Triangular pyramidal | 132 |
| 32 | 443CT | B | 3% H$_2$SO$_4$ | Alternating current, electric current density 5 A/dm$^2$, 4.5 s | 5% HF 55° C. | 240 | 93 | Triangular pyramidal | 61 |
| 33 | 443CT | C | 3% H$_2$SO$_4$ | Alternating current, electric current density 5 A/dm$^2$, 4.5 s | 5% HF 55° C. | 240 | 84 | Triangular pyramidal | 58 |
| 34 | 443CT | D | 3% H$_2$SO$_4$ | Alternating current, electric current density 5 A/dm$^2$, 4.5 s | 5% HF 55° C. | 240 | 94 | Triangular pyramidal | 71 |
| 35 | 443CT | E | 3% H$_2$SO$_4$ | Alternating current, electric current density 5 A/dm$^2$, 4.5 s | 5% HF 55° C. | 240 | 65 | Triangular pyramidal | 67 |
| 36 | 443CT | F | 3% H$_2$SO$_4$ | Alternating current, electric current density 5 A/dm$^2$, 4.5 s | 10% HF 50° C. | 600 | 97 | Triangular pyramidal | 93 |

| | Surface texture | | | | Performance evaluation | | | | |
|---|---|---|---|---|---|---|---|---|---|
| No. | Average height of trapezoidal projection (μm) | Average diameter of trapezoidal projection (μm) | Area percentage of trapezoidal projection (%) | Contact resistance (mΩ · cm$^2$) 20 kgf per side | Contact resistance after 500 h durability test (mΩ · cm$^2$) 20 kgf per side | Increase in contact resistance due to 500 h durability test (mΩ · cm$^2$) 20 kgf per side | Contact resistance after sliding test (mΩ · cm$^2$) 20 kgf per side | Increase in contact resistance due to sliding test (mΩ · cm$^2$) 20 kgf per side | Note |
| 18 | 0.08 | 10.2 | 9.2 | 4.05 | 7.66 | 3.61 | 7.68 | 3.63 Δ | Example |
| 19 | 0.36 | 11.3 | 10.9 | 4.28 | 6.36 | 2.08 | 4.87 | 0.59 ⊚ | Example |
| 20 | 0.76 | 12.6 | 18.3 | 4.53 | 5.36 | 0.83 | 4.92 | 0.39 ⊚ | Example |
| 21 | 0 | 0 | 0 | 5.45 | 9.02 | 3.57 | 15.40 | 9.95 Δ | Example |

TABLE 3-continued

| 26 | 0 | 0 | 0 | 8.92 | 30.10 | 21.18 | 23.40 | 14.48 | X | Comparative example |
|---|---|---|---|---|---|---|---|---|---|---|
| 29 | 0.15 | 15.6 | 13.5 | 4.11 | 6.32 | 2.21 | 6.53 | 2.42 | ○ | Example |
| 30 | 1.24 | 9.6 | 23.4 | 4.32 | 5.36 | 1.04 | 4.65 | 0.33 | ◎ | Example |
| 31 | 0.74 | 9.9 | 16.8 | 5.19 | 6.87 | 1.68 | 6.08 | 0.89 | ◎ | Example |
| 32 | 0.74 | 11.1 | 5.6 | 4.11 | 5.03 | 0.92 | 6.02 | 1.91 | ○ | Example |
| 33 | 0.65 | 4.5 | 9.5 | 4.56 | 5.31 | 0.75 | 6.89 | 2.33 | ○ | Example |
| 34 | 0.57 | 8.7 | 3.4 | 4.23 | 5.16 | 0.93 | 8.93 | 4.70 | Δ | Example |
| 35 | 0.63 | 10.1 | 33.2 | 5.37 | 7.25 | 1.86 | 11.30 | 5.93 | Δ | Example |
| 36 | 0.26 | 26.4 | 28.3 | 4.61 | 5.97 | 1.36 | 7.12 | 2.51 | ○ | Example |

Table 3 shows that the examples in which a fine textured structure having a triangular pyramidal top was disposed on the surface thereof and the area percentage of dispersed trapezoidal projection structures having an average height of 0.15 μm or more and 2 μm or less was 5% or more and 30% or less had a small increase in contact resistance due to the sliding test. Thus, the examples maintain a low contact resistance after contact of the materials with each other or contact of the material with another component or the like, or after processing into a separator component, and are therefore advantageous from a practical standpoint. After the profile measurement, the SEM observation of the surface in the same visual field showed that the trapezoidal projection structures corresponded to crystal grains on the stainless steel surface. An examination of crystal orientation using the EBSD method showed that the (100) plane of the trapezoidal projection structures was almost perpendicular to the surface of the sample. Although a comparative example having an average diameter out of the range of the present invention when viewed from the top is not listed, the examples had satisfactory results when the average diameter ranged from at least 4.5 to 15 μm.

REFERENCE SIGNS LIST

1 membrane-electrode assembly
2 gas diffusion layer
3 gas diffusion layer
4 separator
5 separator.
6 air channel
7 hydrogen channel

The invention claimed is:

1. A stainless steel having a low surface contact resistance for fuel cell separators and a Cr content in the range of 16 to 40 mass %, wherein
   the stainless steel includes a region having a fine textured structure on its surface, the area percentage of the region being 50% or more, and
   the region having a fine textured structure is a region which has a structure having depressed portions and raised portions at an average interval between the depressed portions or the raised portions of 20 nm or more and 150 nm or less when observed with a scanning electron microscope,
   wherein the raised portions of the fine textured structure have a triangular pyramidal top having an average angle of 80 degrees or more and 100 degrees or less, and
   the stainless steel includes trapezoidal projection structures having an average height of 0.15 μm or more and 2 μm or less and an average diameter of 3 μm or more and 50 μm or less, the area percentage of the dispersed trapezoidal projection structures being 5% or more and 30% or less.

2. The stainless steel having a low surface contact resistance for fuel cell separators according to claim 1, wherein the area percentage is 80% or more.

3. The stainless steel having a low surface contact resistance for fuel cell separators according to claim 1, wherein the triangular pyramidal tops of the raised portions are disposed at an average interval of 100 nm or less.

4. The stainless steel having a low surface contact resistance for fuel cell separators according to claim 1, wherein the trapezoidal projection structures correspond to crystal grains of the stainless steel.

5. The stainless steel having a low surface contact resistance for fuel cell separators according to claim 1, wherein the area percentage is 80% or more, and
   the triangular pyramidal tops of the raised portions are disposed at an average interval of 100 nm or less.

6. The stainless steel having a low surface contact resistance for fuel cell separators according to claim 1, wherein the area percentage is 80% or more, and
   the trapezoidal projection structures correspond to crystal grains of the stainless steel.

7. The stainless steel having a low surface contact resistance for fuel cell separators according to claim 1, wherein the triangular pyramidal tops of the raised portions are disposed at an average interval of 100 nm or less, and
   the trapezoidal projection structures correspond to crystal grains of the stainless steel.

8. The stainless steel having a low surface contact resistance for fuel cell separators according to claim 1, wherein the area percentage is 80% or more,
   the triangular pyramidal tops of the raised portions are disposed at an average interval of 100 nm or less, and
   the trapezoidal projection structures correspond to crystal grains of the stainless steel.

9. The stainless steel having a low surface contact resistance for fuel cell separators according to claim 1, wherein the stainless steel has a surface contact resistance of 10 mΩ·cm$^2$ or less.

10. The stainless steel having a low surface contact resistance for fuel cell separators according to claim 1, wherein after the stainless steel is immersed in a sulfuric acid solution containing 0.1 ppm fluoride ions at pH 3 and at 80° C. for 24 hours at 0.6 V versus a Ag—AgCl reference electrode, the stainless steel has a surface contact resistance of 10 mΩ·cm$^2$ or less.

11. The stainless steel having a low surface contact resistance for fuel cell separators according to claim 1, wherein after the stainless steel is immersed in a sulfuric acid solution containing 0.1 ppm fluoride ions at pH 3 and at 80° C. for 500 hours at 0.6 V versus a Ag—AgCl reference electrode, the stainless steel has a surface contact resistance of 10 mΩ·cm$^2$ or less.

* * * * *